United States Patent
Hutchins

(10) Patent No.: US 8,324,635 B2
(45) Date of Patent: Dec. 4, 2012

(54) MULTI-ELEMENT LED LAMP PACKAGE

(75) Inventor: Edward Lloyd Hutchins, Raleigh, NC (US)

(73) Assignee: Cree, Inc., Durham, NC (US)

( * ) Notice: Subject to any disclaimer, the term of this patent is extended or adjusted under 35 U.S.C. 154(b) by 21 days.

(21) Appl. No.: 12/895,108

(22) Filed: Sep. 30, 2010

(65) Prior Publication Data
US 2011/0018466 A1 Jan. 27, 2011

Related U.S. Application Data

(62) Division of application No. 11/416,804, filed on May 3, 2006, now Pat. No. 7,829,899.

(51) Int. Cl.
*H01L 29/15* (2006.01)
(52) U.S. Cl. ........... 257/79; 257/89; 257/94; 257/96; 257/98; 257/E25.02
(58) Field of Classification Search .......... 257/79, 257/89, 94, 96, 98
See application file for complete search history.

(56) References Cited

U.S. PATENT DOCUMENTS

| | | | |
|---|---|---|---|
| 6,149,283 | A | 11/2000 | Conway et al. |
| 6,273,596 | B1 | 8/2001 | Parkyn |
| 6,350,041 | B1 | 2/2002 | Tarsa et al. |
| 6,577,073 | B2 | 6/2003 | Shimizu et al. |
| 6,593,597 | B2 | 7/2003 | Sheu |
| 7,064,353 | B2 | 6/2006 | Bhat |
| 7,821,212 | B2 | 10/2010 | Wray |
| 2002/0004251 | A1 | 1/2002 | Roberts et al. |
| 2003/0053310 | A1* | 3/2003 | Sommers ............... 362/231 |
| 2003/0067769 | A1 | 4/2003 | Gilpin |
| 2003/0189830 | A1* | 10/2003 | Sugimoto et al. ......... 362/294 |
| 2004/0037076 | A1 | 2/2004 | Katoh et al. |
| 2004/0105262 | A1 | 6/2004 | Tseng et al. |
| 2005/0073244 | A1 | 4/2005 | Chou et al. |
| 2005/0083686 | A1 | 4/2005 | Yatsuda et al. |
| 2005/0094401 | A1 | 5/2005 | Magarill |

(Continued)

FOREIGN PATENT DOCUMENTS

DE 10 2005 049685 A1 4/2007

(Continued)

OTHER PUBLICATIONS

Brukilacchio, Thomas, et al., "Beyond the limitations of todays LED packages: optimizing high brightness LED performance by a comprehensive systems . . . ", "Proceedings of SPIE", Jun. 2004, pp. 161-172, vol. 5366.

(Continued)

*Primary Examiner* — A. Sefer
(74) *Attorney, Agent, or Firm* — Vincent K. Gustafson; Jenkins, Wilson, Taylor & Hunt, P.A.

(57) ABSTRACT

In one embodiment, a single light emitting diode lamp package includes at least two light emitting devices that can be switched independently of one another and thus may be useful in vehicular lighting applications, for example low and high beam headlights. In another embodiment, a LED device includes a first LED die and at least one additional LED die disposed at different positions within a common reflector cup. Multiple LED sub-assemblies may be mounted to a common lead frame along non-coincident principal axes. Methods for varying intensity or color from multi-LED lamps are further provided.

40 Claims, 7 Drawing Sheets

U.S. PATENT DOCUMENTS

| | | |
|---|---|---|
| 2005/0265024 A1 | 12/2005 | Luk |
| 2007/0030675 A1* | 2/2007 | Oon et al. .................... 362/237 |
| 2007/0247852 A1 | 10/2007 | Wang |
| 2007/0257272 A1 | 11/2007 | Hutchins et al. |
| 2008/0019124 A1 | 1/2008 | Smith et al. |
| 2008/0290353 A1 | 11/2008 | Medendorp, Jr. et al. |
| 2009/0001490 A1 | 1/2009 | Bogner et al. |
| 2009/0212709 A1 | 8/2009 | Meijer et al. |
| 2009/0230893 A1 | 9/2009 | Holh-AbiChedid et al. |

FOREIGN PATENT DOCUMENTS

| | | |
|---|---|---|
| JP | 01-097301 A | 4/1989 |
| JP | 03-295101 A | 12/1991 |
| JP | 07-183581 A | 7/1995 |
| JP | 07183581 A | 7/1995 |
| JP | 10-173236 A | 6/1998 |
| JP | 10-247404 A | 9/1998 |
| JP | 10-335709 A | 12/1998 |
| JP | 2000-214803 A | 8/2000 |
| JP | 2001-156341A | 6/2001 |
| JP | 2002-094129 A | 3/2002 |
| JP | 2004-104077 A | 4/2004 |
| JP | 2004-111355 A | 4/2004 |
| JP | 2004-128434 A | 4/2004 |
| JP | 2004-303639 A | 10/2004 |
| JP | 2005-536870 A | 12/2005 |
| JP | 2006-504249 A | 2/2006 |
| JP | 2006-073691 A | 3/2006 |
| WO | WO-2006054236 A2 | 5/2006 |

OTHER PUBLICATIONS

Dawson, Martin D., "Semiconductor optoelectronics at the Institute of Photonics: materials and devices (Presentation)", 2004, p. 29 Slides, Publisher: The Institute of Photonics.

Hymite GMBH, "Wafer level packaging solution for HB LED applications", "HyLED (TM) Generic LED Package: Preliminary Specification", Dec. 14, 2005.

Partial European Search Report issued on Nov. 29, 2011 in European Patent Application No. 11 18 6407.

Extended European Search Report issued May 31, 2012 in European Patent Application No. 11 18 6407.

Office Action issued on Jun. 26, 2012 in Japanese Patent Application No. 2009-510000.

* cited by examiner

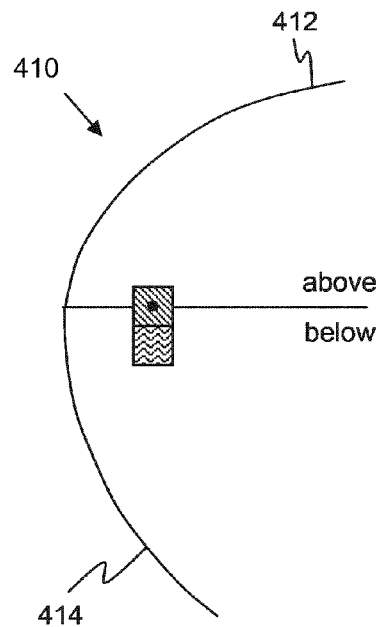
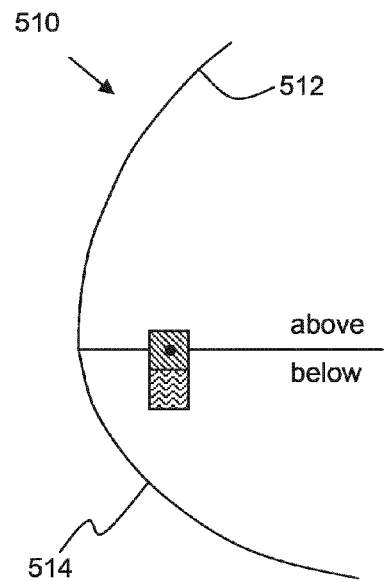
FIGURE 9  FIGURE 10
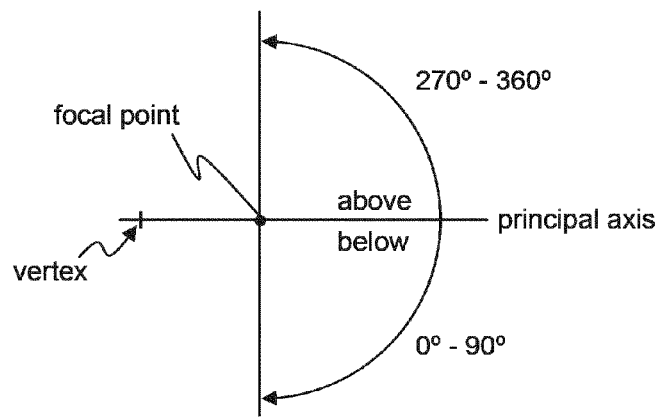
FIGURE 11

MULTI-ELEMENT LED LAMP PACKAGE

CROSS-REFERENCE TO RELATED APPLICATION

This is a divisional of U.S. patent application Ser. No. 11/416,804 filed May 3, 2006 and published as US2007-0257272A1 on Nov. 8, 2007. The disclosure of the foregoing application is hereby incorporated herein by reference in its respective entirety, for all purposes, and the priority of such application is hereby claimed under the provisions of 35 U.S.C. §120.

FIELD OF THE INVENTION

The present invention relates to a light source assembly including a plurality of LED elements that can be switched independently of one another, said light source assembly being useful for various applications including vehicular headlights and running lights.

DESCRIPTION OF THE RELATED ART

In the field of exterior and interior illumination of motor vehicles, light-emitting diodes (LEDs) are being increasingly used instead of conventional incandescent bulbs, particularly for tail lights and brake lights, since LEDs have a longer service life, better efficiency in converting electrical energy into radiation energy in the visible spectral range, lower thermal emission characteristics, and reduced space requirements.

The practical advantages of utilizing LED lamps instead of incandescent bulbs are many. The operational lifetime (in this case, defined as continuous illumination service) of a LED is on the order of ten years or over 50,000 hours, whereas incandescent bulbs often burn out after about 2,000 hours of service. Additionally, LED lamps are considerably more robust. When exposed to mechanical shocks or stresses, chemical stresses (e.g., such as may be caused by cleaning chemicals or road salt), or the presence of or temperature variations often encountered in an outdoor environment, LEDs are less likely to fail than incandescent lamps. This attribute is especially important when the lamp is utilized in motor vehicles wherein perishable filaments of incandescent lamps frequently break due to constant vibrational motion. Further, incandescent and fluorescent lamps are constructed with fragile glass exterior casings whose breakage compromises the operational utility of the lamp. In contrast, the solid state LED lamp has no filaments to break and is usually housed within a durable plastic casing, thereby exhibiting a high level of imperviousness to extreme outdoor environmental stresses. A further advantage of LEDs is that they have a more rapid turn-on time and generate less heat per lumen of light relative to conventional lighting products. The compact size and flexibility of form of LEDs offer still further advantages in relaxing space constraints and providing freedom to the designer to adopt new styling configurations, such as may be useful to create brand recognition.

A LED is a solid-state device having a PN junction semiconductor diode that emits light when a current is applied. LEDs operate at relatively low current and voltage and emit substantially less heat per lumen than standard halogen or high intensity discharge (HID) lamps. The LED can be easily encapsulated in a resin material to protect the device and thus make it durable and long lasting. The use of semiconductor LEDs solves many problems associated with incandescent bulbs including, but not limited to, high entrapped heat, limited lamp longevity, frequent lamp replacement and higher current operation.

Recently, higher brightness white light LED lamps have become increasingly affordable to manufacture and now present attractive substitutes for incandescent, halogen, and high intensity discharge (xenon discharge lamp) (HID) vehicle lamp sources. There are currently three methods for producing LEDs that emit white light. The first and second methods use a single blue, violet or UV LED die that emits a single wavelength of radiation, either with a phosphoric coating thereon or a phosphoric layer between the encapsulant and the lens, with the phosphor converting portions of the light into longer wavelengths that lead to the perception of white light. The third method uses independent red, blue, and green dies in the same package. When all three are powered, white light is perceived.

Although more attractive as the illuminating source for the reasons enumerated above, LEDs have not become the favored light source for headlights and other lighting sources. For example, light distribution characteristics (particularly for low beam headlamps) of vehicle headlamps have been standardized, requiring a horizontal line that reduces glare on oncoming vehicles. Additionally, a minimum center luminous intensity of 8000 cd or more in the front view facilitates a driver's far distance visibility. These requirements are not readily satisfied using the single element reflector cup package known in the art.

Headlamps including multiple LED packages have been proposed to achieve desired levels of total brightness and/or directionality. Each LED package includes a LED die plus a dedicated lead frame, reflector cup, encapsulant, and lens. The presence of multiple packages, particularly those redundant packages required to switch directionality, substantially increases the cost of the overall headlamp assembly and consumes significant volume, thus reducing packaging efficiency and reducing design options.

Accordingly, there is a continuing need in the art for improved multi-LED light source assemblies that minimize lamp package quantities and footprint while enabling directional switching for vehicular and/or other lighting applications.

SUMMARY OF THE INVENTION

The present invention relates in one aspect to a multi-LED light source assembly employing a plurality of LED elements in a single package, with each LED element capable of being switched independently of one another. At least two LEDs may be arranged in the same package assembly to focus light in the same or different directions without changing the position of the assembly.

In another aspect, the invention relates to a light emitting diode (LED) lamp, comprising: a reflector cup having a vertex, a focal point, a principal axis, an inside surface, and an open face; a first LED die disposed within the reflector cup at a first position at the focal point of the reflector; and at least one additional LED die disposed within the reflector cup at position different from the first position. The position different from the first position may be other than along the principal axis, or may be along the principal axis but not coincident with the focal point.

In another aspect, the invention relates to a light emitting diode (LED) package comprising: a first LED sub-assembly comprising a first LED die, a first reflector having a first principal axis, and a first lens; a second LED sub-assembly comprising a second LED die, a second reflector having a second principal axis, and a second lens; and a common lead frame, wherein the first LED sub-assembly and the second LED sub-assembly are mounted to the common lead frame, the first LED sub-assembly is adapted to emit a first beam in a first direction, and the second LED sub-assembly is adapted to emit a second beam in a second direction that is different from the first direction. In one embodiment, each of the first LED sub-assembly and the second LED sub-assembly is independently controlled.

In another aspect, the invention relates to a method of adjusting any of the intensity, color, and direction of light originating from a light emitting diode (LED) lamp, the method including the steps of: providing multiple LED die within a reflector cup with a first LED die disposed at the focal point and at least one additional die at a location other than along the principal axis of the reflector cup; and independently operating the first LED die and the at least one additional LED die.

In another aspect, the invention relates to a method of adjusting the color of light originating from a light emitting diode (LED) lamp, the method comprising the steps of: providing a reflector cup having a vertex, a focal point, a principal axis, an inside surface, and an open face; providing a first RGB LED within the reflector cup, the first RGB LED having a first red die, a first green die, and a first blue die; providing a second RGB LED within the reflector cup, the second RGB LED having a second red die, a second green die, and a second blue die; and independently operating at least one of: any of the red dies, the blue dies, and the green dies.

In another aspect, any of the foregoing aspects may be combined for additional advantage.

Other aspects, features and embodiments of the invention will be more fully apparent from the ensuing description and claims.

BRIEF DESCRIPTION OF THE DRAWINGS

FIG. 9 is a schematic illustration of another alternative reflector having two partial paraboloids (the upper partial paraboloid having a smaller focal length than the lower partial paraboloid) with a common apex for use with a lamp assembly according to the present invention.

FIG. 10 is a schematic illustration of another alternative reflector having two partial paraboloids (the upper partial paraboloid having a larger focal length than the lower partial paraboloid) with having a common apex for use with a lamp assembly according to the present invention.

FIG. 11 is a schematic depicting the relevant axes of a reflector relative to the angles of reflection.

DETAILED DESCRIPTION AND PREFERRED EMBODIMENTS OF THE INVENTION

Figure 1:
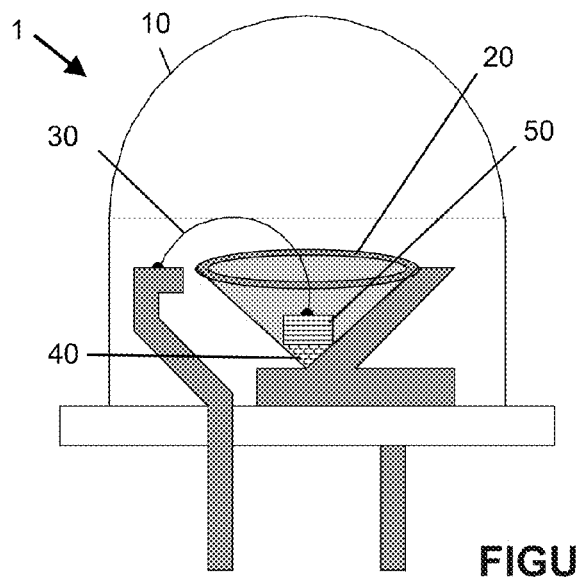
FIG. 1 is a schematic of a conventional single element reflector cup lamp package known in the art.

The present invention relates to an LED light source assembly and method of using same, and vehicular and/or portable lighting products incorporating such assemblies. The inventive LED light source assembly is ideally suited as a source of illumination for light sources of the type employing reflective surfaces to produce one or more beams of light.

Automobiles typically employ headlamps capable of operating in two modes: (1) low beam mode, wherein light typically of a first intensity is directed in a first pattern ahead of the vehicle and down toward the road surface to avoid dazzling drivers of opposing vehicles; and (2) high beam mode, wherein light typically of a second, higher intensity is directed in a second pattern ahead of the vehicle and slightly upward to provide greater forward visibility in low-light and typically low-traffic areas having fewer or no opposing vehicles.

A simple method for generating distinct low beam and high beam patterns is to provide separate high beam and low beam lamps each aimed differently. A dedicated low beam lamp is activated to generate the low beam pattern, and a dedicated high beam lamp is activated to generate the high beam pattern.

Another method for generating distinct low and high beam patterns is to provide two light sources with a shared reflector. One light source is used for the low beam mode, and the other light source is used for the high beam mode, with each light source positioned differently relative to the shared reflector. To switch from low to high beam operation, a switch is toggled to activate the high beam light source.

It is also desirable to periodically operate automotive headlamps at levels below those of ordinary low beam mode to serve as daytime running lights (DRLs). DRL operation is conventionally achieved with dedicated low wattage incandescent bulbs disposed in high or low beam headlamps, or by operating incandescent high beam headlamps at substantially reduced output (e.g., with a pulsed input signal).

In either low or high beam mode, entire headlamp assemblies may be repositioned utilizing conventional technologies. For example, certain automakers (e.g., Lexus) have recently implemented headlamp assemblies with reflectors that mechanically (automatically) adjust from side to side with steering inputs to enhance illumination while cornering. Additionally certain automakers (e.g., BMW) provide high intensity discharge headlamp assemblies that are linked to level sensors and are servo-actuated to "dip" the reflector downward automatically if the automobile pitches upward so as to avoid blinding oncoming drivers with flashes of light as the vehicle so equipped crests a sharp rise in the travel surface.

Embodiments of the present invention are directed to a common package or common lamp including multiple associated LED dies, with individual LED dies preferably being switched independently from one another. In one embodiment, multiple LED dies are provided with a common reflector in a single lamp. In another embodiment, multiple LED dies are provided in a single package assembly, thus utilizing a common lead frame, reflector, encapsulant, and lens. Individual LEDs within a multi-LED lamp may be activated to adjust the intensity and/or direction of the resulting light beam.

The provision of multiple dies per reflector and/or package assembly provides tangible benefits. For example, the use of multiple dies can obviate the need for discrete low and high beam headlamps—or, for that matter for separate left and right beams, if desired. Lighting package assemblies can therefore be placed closer together, leading to a smaller lamp package and a more uniform light source.

In general, a LED includes a die, a lead frame, and an encapsulation material (e.g., an epoxy). The LED die includes a multi-layer optoelectronic device with one or more active (light-emitting) layers deposited over a substrate. Active layers typically comprise III-V nitride materials (such as GaN, AlN, InN, or alloys thereof such as AlGaN or InGaN), whether provided in pure form or as alloys, such as of Aluminum, Gallium, Indium, Arsenic, and/or Phosphorus (e.g., GaAs, AlGaAs, GaPAs, etc.). Typical LED substrate materials include SiC and sapphire for III-V nitride materials, and GaAs for alloy-containing materials, but other substrate materials may be employed. To optimize brightness of the LED output, the substrate is preferably selected to be transparent to the wavelength of light produced by the LED; alternatively, if the substrate is not transparent, then its thickness is minimized to reduce absorption as much as possible. Conductive substrates (e.g., SiC) are preferably employed to minimize the number of light-absorptive wire bonds and contact pads on the front surface of the LED (since insulating substrates such as sapphire require two frontside wire bonds and corresponding metal contact pads). A LED lead frame serves to not only physically support the die but also provide electrical and thermal conduction paths to and from the die. The encapsulation material surrounds and protects the die, and further serves to disperse light emitted from the die.

FIG. 1 is a schematic of a conventional single element reflector cup lamp package 1, with the LED die 50 being symmetrically positioned within a reflector cup 20 disposed on a heat spreader 40. The LED die is wire-bonded 30 to a post and the entire unit is covered by a lens 10. In these conventional LED packages, a single wire bond connection may be provided to the top surface of the LED die, with the electrical ground connection being made either through the backside of the die or through a second wire (not shown) bonded to the top surface of the die (e.g., such as may be useful if an insulating material like sapphire is used for substrate of the active region of the die).

In conventional LED lighting assemblies, such as shown in FIG. 1, the entire reflector cup is contained within the lens. As a result, the thermal conductivity of the package is very low, since the small electrical lead posts are also the only viable thermal conduction pathways. This package is therefore of limited use for high brightness (and high power) LED dies.

Figure 2:
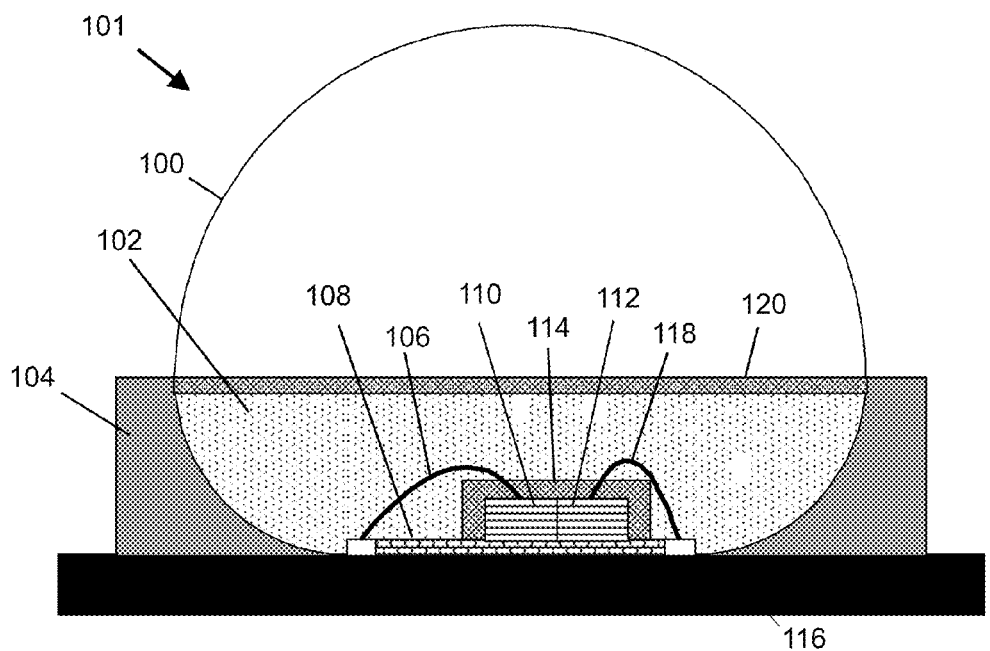
FIG. 2 is a side cross-sectional schematic of a first surface mount LED package according to the present invention, the package including multiple elements disposed under a symmetric lens.

In contrast, FIG. 2 illustrates a surface mount package 101 with multiple elements according to one embodiment of the present invention. Surface mount packages are preferred due to the thermal requirements of high-power LEDs. Instead of relying upon two small electrical lead posts to conduct heat away from the die, a large, electrically isolated section of the lead frame is used as a thermal pathway. Despite the specific representation of FIG. 2, it is to be understood that various types of surface mounting technologies may be used, and that the particular illustrated configuration is not intended to be limiting in this regard. One or more wire bonds may be provided at the top surface to serve as electrical connections. Vias through the LED die may also be used to conduct electricity to the top surface. Flip-chip mounts may be used; in such an instance, the back free surface of the substrate may be faceted or omitted entirely to enhance light extraction if desired.

In FIG. 2, LED-A 110 and LED-B 112 are both positioned on a heat spreader 108, which itself is positioned within a reflector cup 104. A LED-A wire-bond 106 and a LED-B wire-bond 118 are positioned to contact the LED dies 110, 112 to adjacent posts. The entire double LED unit is encapsulated with an encapsulant 102 within the reflector cup 104 under a (symmetric) lens 100 and positioned upon a lead frame 116 containing both electrical and thermal contacts and conduction paths. Two alternative phosphoric layers (i.e., coating 114 and layer 120) are provided for illustrative purposes only; depending on the method used to generate LED light, both would not be provided in combination, and neither coating is required in certain systems.

As discussed herein, to date, white light LEDs include either (i) a single blue, violet or UV LED die that emits a single wavelength of radiation, the LED die including a phosphor coating that converts portions of the light into longer wavelengths, (ii) a single blue, violet or UV LED die that emits a single wavelength of radiation, the LED lamp having an associated phosphoric layer disposed between the encapsulant and the lens, or (iii) independent red, blue and green dies in the same package that in combination create the perception of white light when all three are powered.

Specific implementations of the inventive surface mount LED package having multiple LED sources that can be switched independently (e.g., to emit light in multiple directions) depend upon which of the above-mentioned three methods are used for generating white light, as discussed in further detail below.

Surface mount packages including white light LEDs that each have a single blue, violet or UV LED die for emitting a single wavelength of radiation therefrom, with a phosphoric coating (e.g., coating 114 over LED-A 110 and LED-B 112 in FIG. 2) on the LED die itself (i.e., and lacking any coating 120 between the encapsulant 102 and the lens 100), may be characterized by at least one of the following arrangements:

(A) LED-A has a first reflector cup/lens/first single die assembly and LED-B has a second reflector cup/lens/second single die assembly, wherein LED-A and LED-B are positioned to contact the same lead frame and wherein the first single die assembly is oriented at a different angle relative to the second single die assembly; (see FIG. 4, which illustrates such a package 191);

(B) within a single reflector cup, LED-A is positioned at the focus of the assembly while LED-B is positioned at a location other than the focus;

(C) two die are positioned within a single symmetric reflector cup having an asymmetric lens to direct the light from one die away from that of the second die; (see FIG. 3, which illustrates such a package 131)

(D) two die are positioned within a single asymmetric reflector cup having a symmetric lens to direct the light from one die away from that of the second die;

(E) two die are positioned within a single asymmetric reflector cup having an asymmetric lens to direct the light from one die away from that of the second die; and (F) combinations thereof.

Surface mount packages including white light LEDs that each have a single blue, violet or UV LED die for emitting a single wavelength of radiation therefrom, with a phosphoric layer (e.g., layer 120 in FIG. 2) located between encapsulant 102 and the lens 100 (see FIG. 2), may be characterized by a first LED (e.g., LED-A) having a first reflector cup/lens/first single die assembly and a second LED (e.g., LED-B) having a second reflector cup/lens/second single die assembly, wherein the first and second LEDs are positioned to contact the same lead frame, and wherein the first single die assembly is oriented at a different angle relative to the second single die assembly.

Surface mount packages including white light LEDs which include independent red, green and blue (RGB) die in the same package to create the perception of white light (and therefore not requiring any phosphoric coating 114 or phosphor layer 120 as illustrated in FIG. 2), may be characterized by at least one of the following arrangements:

(A) a first LED (e.g., LED-A) has a first reflector cup/lens/first RGB die assembly and a second LED (e.g., LED-B) has a second reflector cup/lens/second RGB die assembly, wherein LED-A and LED-B are positioned to contact the same lead frame and wherein the first single die assembly is oriented at a different angle relative to the second single die assembly;

(B) within a single reflector cup, RGB LED-A is positioned at the focus of the assembly while RGB LED-B is positioned at a location other than the focus;

(C) two RGB die are positioned within a single symmetric reflector cup having an asymmetric lens to direct the light from one die away from that of the second die;

(D) two RGB die are positioned within a single asymmetric reflector cup having a symmetric lens to direct the light from one die away from that of the second die;

(E) two RGB die are positioned within a single asymmetric reflector cup having an asymmetric lens to direct the light from one die away from that of the second die; and (F) combinations thereof.

It is contemplated that the foregoing embodiments may be incorporated into alternative packaging apparatuses, including reflector cup lamp packages known in the art (e.g., such as illustrated in FIG. 1, but including at least one another die), as well as conventional panel mount, PC mount, Sidelooker, and Subminiature package types.

Figure 3:
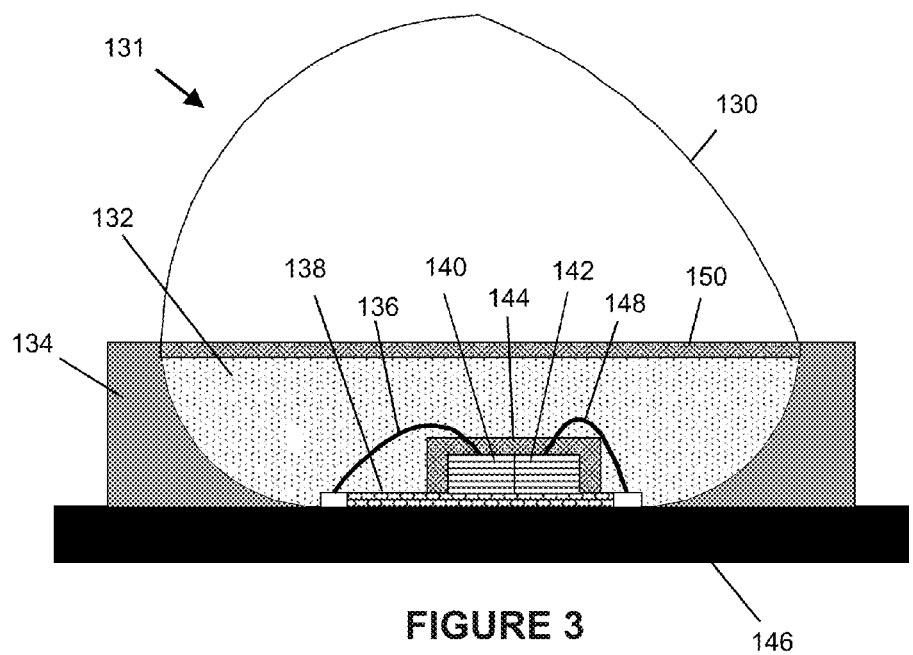
FIG. 3 is a side cross-sectional schematic of a second surface mount LED package according to the present invention, the package including multiple elements disposed under an asymmetric lens.

FIG. 3 illustrates a multi-element LED package 131 substantially identical to the package 101 depicted in FIG. 2, but the package of 131 includes an asymmetric lens 100. In FIG. 3, LED-A 140 and LED-B 142 are both positioned on a heat spreader 138, which itself is positioned within a reflector cup 134. A LED-A wire-bond 136 and a LED-B wire-bond 148 are positioned to contact the LED dies 140, 142 to adjacent posts. The entire double LED unit is encapsulated with an encapsulant 132 within the reflector cup 134 under an asymmetric lens 130 and positioned upon a lead frame 146 containing both electrical and thermal contacts and conduction paths. Two alternative phosphoric layers (i.e., coating 144 and layer 150) are provided for illustrative purposes only; depending on the method used to generate LED light, both would not be provided in combination, and neither coating is required in certain systems.

Figure 4:
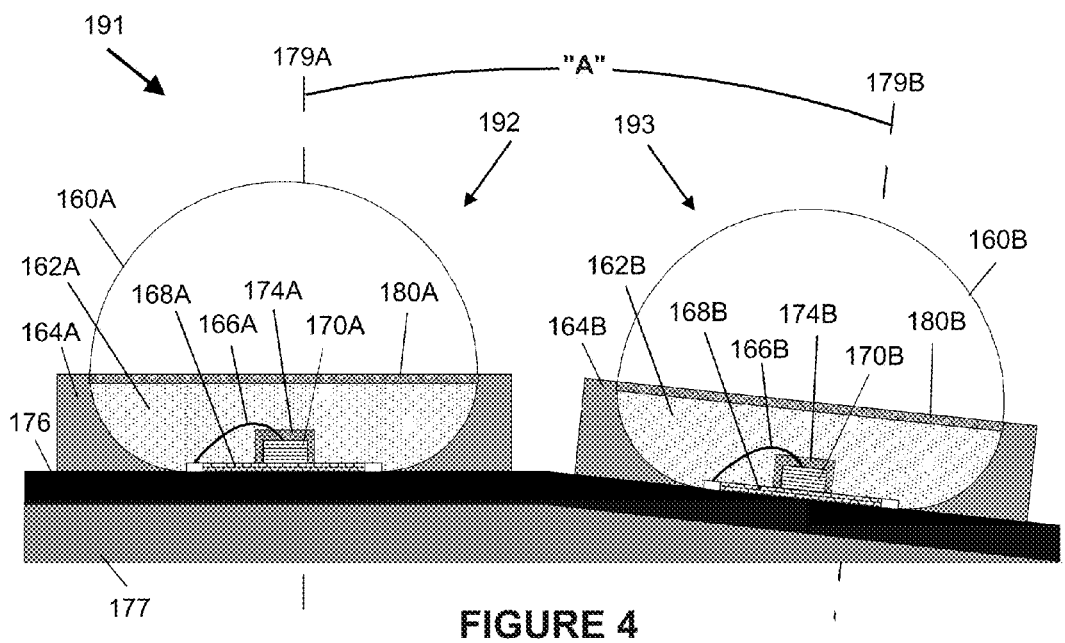
FIG. 4 is a side cross-sectional schematic of a third surface mount LED package according to the present invention, the package including two lamp subassemblies mounted to a common lead frame, the subassemblies having non-parallel principal axes with symmetric lenses, symmetric reflectors, and die placed along the principal axis of each subassembly.

FIG. 4 illustrates a surface mount LED package 191 according to the present invention, the package 191 including two lamp subassemblies 192, 193 having non-coincident and non-parallel principal axes 179A, 179B separated by an angle "A" and being mounted to a common lead frame 176 having electrical and thermal contacts, and conduction paths. While only two lamp subassemblies 192, 193 are depicted in FIG. 4, it is to be understood that any desirable number of lamp subassemblies may be mounted along various principal axes to a common lead frame 176. Each lamp subassembly 192, 193 may be independently operated to provide the desired light intensity, direction, and/or color. The lead frame 176 may be further mounted on or otherwise supported by a substrate 177. Each subassembly 192, 193 is illustrated as having a single LED die 170A, 170B, but could alternatively include multiple LED die as illustrated and described in connection with the packages of FIGS. 2-3. Each lamp subassembly 192, 193 includes a heat spreader 168A, 168B disposed within a reflector cup 164A, 164B. Wire bonds 166A, 166B are provided to provide electrical contact between the LED dies 170A, 170B and adjacent posts. Each LED die 170A, 170B is encapsulated with an encapsulant 162A, 162B with the respective reflector cup 164A, 164B under a lens 160A, 160B. A common encapsulant and common lens may be used for multiple LED die. Phosphoric layers of alternative types (i.e., coatings 174A, 174B and layers 180A, 180B) may further be provided.

In embodiments according to the present invention, the entire reflector lamp is preferably manufactured as a complete light package, wherein the LED dies are protected from the elements by an enclosed encapsulant/reflector/lens covering combination.

Reflector cup shapes contemplated herein, of types both symmetric and asymmetric, are illustrated in FIGS. 5-10, as discussed below. It is to be understood that the dimensions and shape of the reflector cups are merely illustrative, and are not intended to limit the dimensions or shapes of reflector cups that may be used with device according to the present invention.

Figure 5:
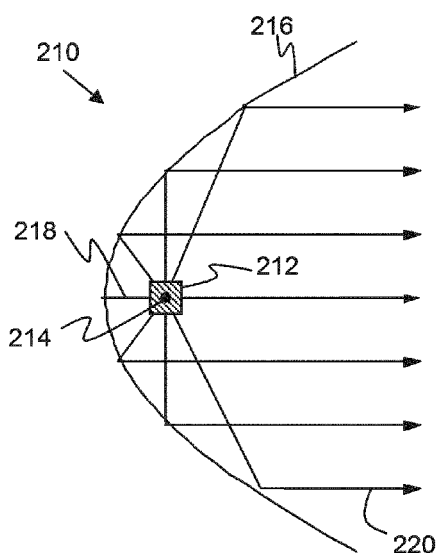
FIG. 5 is a two-dimensional illustration of beam paths generated by a conventional reflector known the in the art, the reflector including one LED die, wherein substantially parallel light beams are reflected parallel to the principal axis of the reflector.

FIG. 5 illustrates a simple reflector headlamp 210 having a single die 212 positioned at the focal point 214 of a paraboloidal reflector surface 216. As is well known to those skilled in the art, light originating from the focal point will travel parallel to the principal axis 218 after reflection off of the paraboloid surface, as illustrated schematically in FIG. 1 by the arrows 220. Although not illustrated in FIG. 1, the headlamp may further include a symmetric or asymmetric lens which may have additional patterns to direct the reflected light beam in preferred directions.

Figure 6:
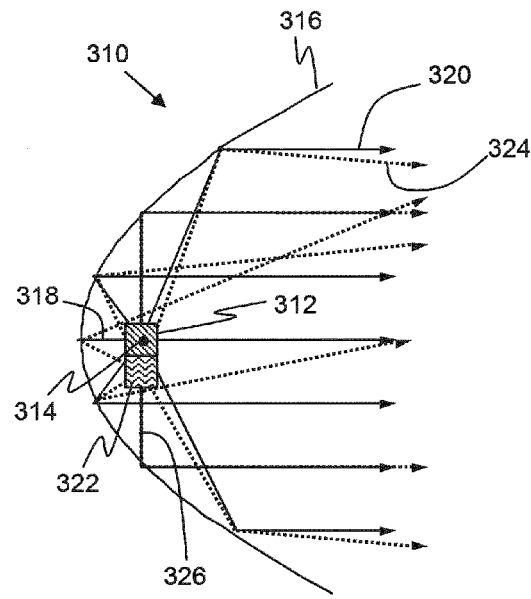
FIG. 6 is a two-dimensional illustration of beam paths generated by a lamp assembly according to the present invention including a reflector and at least two LED dies, wherein light is reflected in at least two different directions.

FIG. 6 illustrates another embodiment of the present invention including a reflector headlamp 310 having a first die 312 positioned at the focal point 314 of the reflector surface 316, whereby light originating from the focal point will travel parallel to the principal axis 318 following reflection off of the reflector surface, as illustrated schematically in FIG. 6 by the arrows 320. In addition, the reflector headlamp 310 includes a second die 322 that is positioned at some location other than along the principal axis 318. In the embodiment illustrated in FIG. 6, the second die 322 is positioned below the first die 312 along an imaginary axis 326 that runs perpendicular to the principal axis 318 at the focal point 314 of the first die. In practice, the second die 322 may be above the first die and/or positioned anywhere along the principal axis at some angle relative to the focal point 314, but not on the principal axis (for example all angles relative to the focal point excluding 0° and 180°). As a further alternative embodiment, a reflector headlamp according to the present invention may include more than two LED dies in the same headlamp assembly (e.g., one die at the focal point and one die each above and below the principal axis, etc.). As yet another alternative, neither of the at least two LED dies are positioned at the focal point. As a still further alternative, one of the at least two LED dies is positioned at the focal point, while the other at least one die is positioned along the principal axis but not at the focal point.

Most of the light originating from the second die 322 will not travel parallel to the principal axis 318 subsequent to reflection off of the reflector. Instead, the reflected light (324, represented by dotted lines in FIG. 6) originating from the second die 322 will travel at various angles relative to the principal axis because the position of the second die 322 does not correspond to a focus of the reflector. In a particularly preferred embodiment, wherein the second die 322 is positioned below the principal axis 318, a substantial portion of the reflected light 324 from the second die 322 will travel at angles 270° to 360° relative to the principal axis, whereby angles 270° to 360° relative to the principal axis is illustrated in FIG. 11 for ease of reference. In other words, if the second die 322 is closer to the ground than the first die 312, a substantial portion of the reflected light from the second die 322 will be pointed upwards from the ground at a variety of angles. Analogously, when the second die 322 is positioned above the principal axis 318, a substantial portion of the reflected light from the second die 322 will travel at angles 0° to 90° relative to the principal axis (see FIG. 11). As defined herein, a "substantial portion of the reflected light" relative to a particular angular range corresponds to greater than 50% of the total amount of reflected light travels in the angular range, more preferably greater than 70% of the total amount of reflected light, and still more preferably greater than 80% of the total amount of reflected light.

Figure 7:
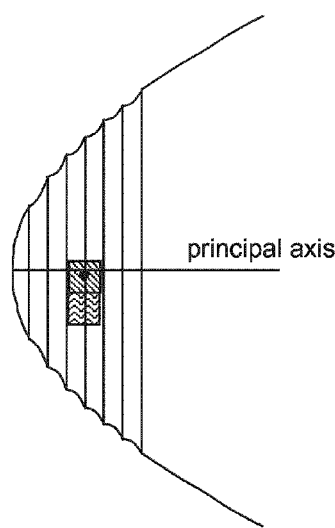
FIG. 7 is a cross-sectional schematic illustration of an alternative reflector having horizontal facets for use with a lamp assembly according to the present invention.
Figure 8:
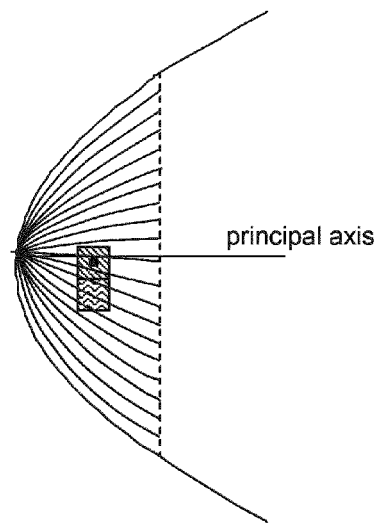
FIG. 8 is a cross-sectional schematic illustration of another alternative reflector having vertical facets for use with a lamp assembly according to the present invention.

It is contemplated herein that the shape of the reflector may be any shape that will reflect light originating from a plurality of LED dies in a plurality of different directions. Contemplated shapes include parabolic shapes such as the aforementioned paraboloid, ellipsoids of revolution, retroreflectors, and compound curves generated by computer programs. Although illustrated as a smooth reflector, a further alternative includes the faceting of the inner surface of the reflector, for example, facets that extend generally horizontally relative to a principal axis, as shown in FIG. 7; that extend generally vertically relative to a principal axis, as shown in FIG. 8; or that extend both horizontally and vertically. Faceting is known to facilitate uniformity of the beam produced thereby. Similar to the reflector shown in FIG. 6, the faceted reflectors illustrated in FIGS. 7 and 8 may have two or more LED dies, and the positioning of the two or more LED dies may correspond to those described with reference to FIG. 6. It should be appreciated that if the inside surface of the reflector is faceted, light originating from the first die may, by design, not travel parallel to the principal axis.

In another embodiment according to the present invention, a reflector includes an asymmetric reflector cup having two partial paraboloids (or any other combination of the aforementioned reflector shapes) with a common vertex, with each paraboloid having different focal distances and a common principal axis. Examples include FIG. 9, wherein the reflector 410 includes an upper partial paraboloid 412 having a smaller focal length than the lower partial paraboloid 414, and FIG. 8, wherein the reflector 510 includes an upper partial paraboloid 512 having a larger focal length than the lower partial paraboloid 514. The positioning of the first die may be at the focal point of either partial paraboloid, as readily determinable by one skilled in the art. Similar to FIGS. 7 and 8, the two partial paraboloid reflectors illustrated in FIGS. 9 and 10 may have faceted or smooth reflector surfaces, may have two or more LED dies, and the positioning of the two or more LED dies may correspond to those described with reference to FIG. 6.

Although not illustrated in FIGS. 6-10, LED headlamps according to the present invention may further include a symmetric or asymmetric lens which may or may not include additional patterns or some other secondary optics to direct the reflected light beam in preferred directions. Alternatively, a flat window lacking curvature and/or optical power may be provided.

Figure 12A:
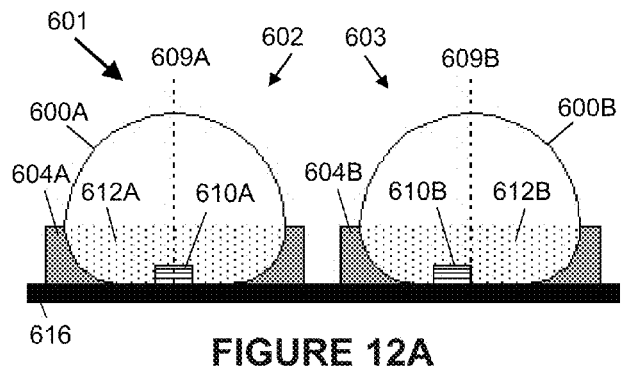
FIG. 12A is a side cross-sectional schematic of a fourth surface mount LED package according to the present invention, the package including two lamp subassemblies mounted to a common lead frame and each having a single die, each subassembly having symmetric lenses and symmetric reflectors, with the die of the first (left) subassembly being disposed coincident with the principal axis, and with the die of the second (right) subassembly being disposed non-coincident with the principal axis.

In further embodiments, various combinations of die placement, lens shape, reflector shape, and—in packages including multiple subassemblies, subassembly placement (angular or otherwise)—may be selected to provide desired functionality. As noted previously, FIG. 4 illustrates a lamp package having two lamp subassemblies mounted to a common lead frame, with the subassemblies having non-parallel principal axes. FIGS. 12A-12N illustrate additional lamp packages according to further embodiments of the invention. For the sake of simplicity, certain features such as wire bonds and phosphoric layers have been omitted from FIGS. 12A-12N, but it is to be understood that such features are intended to be present (where appropriate) in actual LED lamp packages constructed according to the present invention. It is to be further understood that even though FIGS. 12A-12N depict only two die per package and up to two subassemblies, almost any number of die and subassemblies may be provided in any given package according to the present invention.

FIG. 12A illustrates a surface mount LED package 601 including two lamp subassemblies 602, 603 mounted to a common lead frame 616 and each having a single die 610A, 610B. Each subassembly 602, 603 has a symmetric lens 600A, 600B disposed over an encapsulant 612A, 612B and a symmetric reflector 604A, 604B, with the die 610A of the first (left) subassembly 602 being disposed coincident with the principal axis 609A of the subassembly 602, and with the die 610B of the second (right) subassembly 603 being disposed non-coincident with the principal axis 609B of the subassembly 603.

Figure 12B:
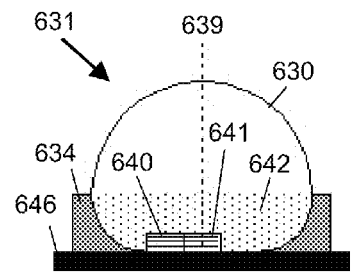
FIG. 12B is a side cross-sectional schematic of a fifth surface mount LED package according to the present invention, the package including multiple die, with one die disposed coincident with principal axis of the subassembly and the other die disposed non-coincident with the principal axis.

FIG. 12B illustrates a surface mount LED package 631 having a lead frame 646 and multiple dies 640, 641, with one die 641 disposed coincident with a principal axis 639 of the package 631 and the other die 640 disposed non-coincident with the principal axis 639. The package 631 further includes a symmetric lens 630 disposed over an encapsulant 642 and a symmetric reflector 634.

Figure 12C:
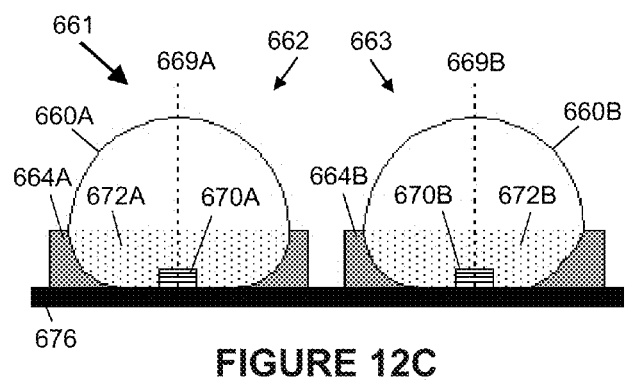
FIG. 12C is a side cross-sectional schematic of a sixth surface mount LED package according to the present invention, the package including two lamp subassemblies mounted to a common lead frame and each having a single die, each subassembly having a symmetric lens and a die disposed along the principal axis, with the first (left) subassembly having a symmetric reflector and the second (right) subassembly having an asymmetric reflector.

FIG. 12C illustrates a surface mount LED package 661 including two lamp subassemblies 662, 663 mounted to a common lead frame 676 and each having a single die 670A, 670B. Each subassembly 662, 663 has a symmetric lens 660A, 660B disposed over an encapsulant 672A, 672B, with the reflector 664A of the first subassembly 662 being symmetric, and the reflector 664B of the second subassembly 663 being asymmetric. Each die 670A, 670B is disposed coincident with the principal axis 669A, 669B of its respective subassembly 662, 663.

Figure 12D:
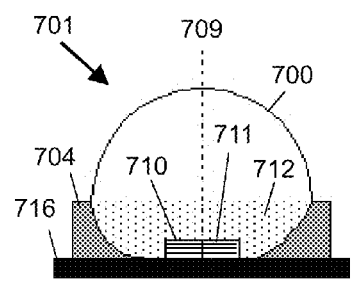
FIG. 12D is a side cross-sectional schematic of a seventh surface mount LED package according to the present invention, the package including multiple die, a symmetric lens, and an asymmetric reflector, with both die being non-coincident with the principal axis but symmetrically arranged equidistantly from the principal axis.

FIG. 12D illustrates a surface mount LED package 701 having a lead frame 716 and two die 710, 711 being disposed non-coincident with the principal axis 709 but symmetrically arranged equidistantly from the principal axis 709. The package 701 further includes a symmetric lens 700 disposed over an encapsulant 712 and an asymmetric reflector 704.

Figure 12E:
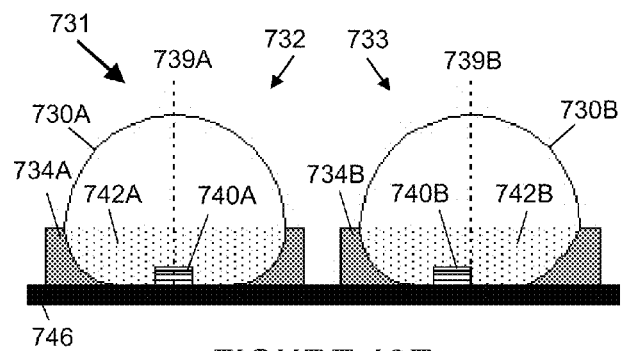
FIG. 12E is a side cross-sectional schematic of a eighth surface mount LED package according to the present invention, the package including two lamp subassemblies mounted to a common lead frame and each having a single die and a symmetric lens, with the first (left) subassembly having a symmetric reflector and a die disposed coincident with the principal axis, and with the second (right) subassembly having an asymmetric reflector and a die disposed non-coincident with the principal axis.

FIG. 12E illustrates a surface mount LED package 731 including two lamp subassemblies 732, 733 mounted to a common lead frame 746 and each having a single die 740A, 740B. Each subassembly 732, 733 has a symmetric lens 730A, 730B disposed over an encapsulant 742A, 742B, with the reflector 734A of the first subassembly 732 being symmetric, and the reflector 734B of the second subassembly 733 being asymmetric. In the first subassembly 732, the die 740A is disposed coincident with the principal axis 739A, and in the second subassembly 733, the die 740B is disposed non-coincident with the principal axis 739B.

Figure 12F:
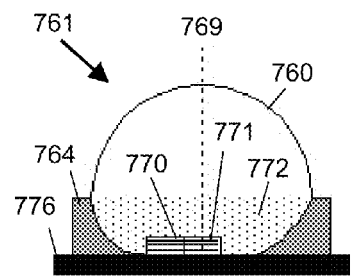
FIG. 12F is a side cross-sectional schematic of a ninth surface mount LED package according to the present invention, the package including multiple die, a symmetric lens, and an asymmetric reflector, with one die disposed coincident with the principal axis and the other die disposed non-coincident with the principal axis.

FIG. 12F illustrates a surface mount LED package 761 having a lead frame 776 and two die 770, 771, with one die 771 disposed coincident with the principal axis 769 and the other die 770 disposed non-coincident with the principal axis 769. The package 761 further includes a symmetric lens 760 disposed over an encapsulant 772 and an asymmetric reflector 764.

Figure 12G:
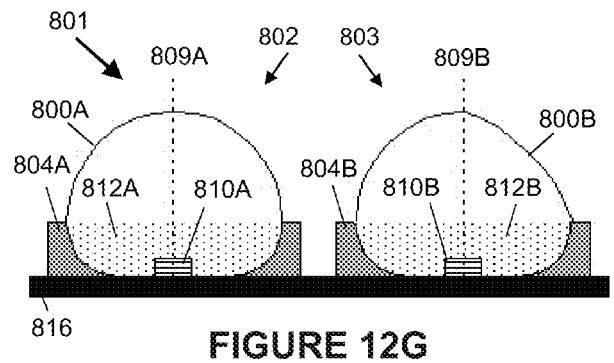
FIG. 12G is a side cross-sectional schematic of a tenth surface mount LED package according to the present invention, the package including two lamp subassemblies mounted to a common lead frame and each having a symmetric reflector and a die disposed coincident with the principal axis, the first (left) subassembly having a symmetric lens and the second (right) subassembly having an asymmetric lens.

FIG. 12G illustrates a surface mount LED package 801 including two lamp subassemblies 802, 803 mounted to a common lead frame 816 and each having a single die 810A, 810B. The first subassembly 802 has a symmetric lens 800A and the second subassembly 803 has an asymmetric lens 800B. Each lens 800A, 800B is disposed over an encapsulant 812A, 812B and a symmetric reflector 804A, 804B, with each die 810A, 810B being disposed coincident with the principal axis 809A, 809B of its respective subassembly 802, 803.

Figure 12H:
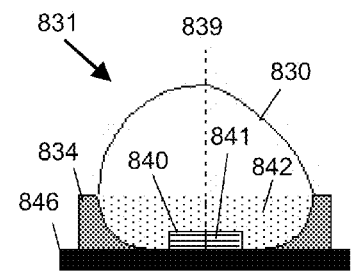
FIG. 12H is a side cross-sectional schematic of an eleventh surface mount LED package according to the present invention, the package including multiple die, a symmetric reflector, and an asymmetric lens, with both die being non-coincident with the principal axis but symmetrically arranged equidistantly from the principal axis.

FIG. 12H illustrates a surface mount LED package 831 having a lead frame 846 and two die 840, 841 The package 831 further includes an asymmetric lens 830 disposed over an encapsulant 842 and a symmetric reflector 834.

Figure 12I:
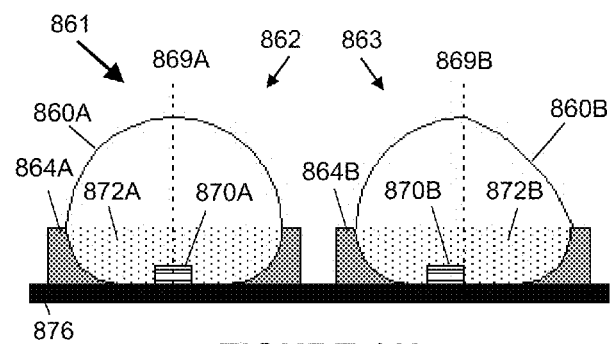
FIG. 12I is a side cross-sectional schematic of a twelfth surface mount LED package according to the present invention, the package including two lamp subassemblies mounted to a common lead frame and each having a symmetric reflector, the first (left) subassembly having a symmetric lens and a die disposed coincident with the principal axis, and the second (right) subassembly having an asymmetric lens and a die disposed non-coincident with the principal axis.

FIG. 12I illustrates a surface mount LED package 861 including two lamp subassemblies 862, 863 mounted to a common lead frame 876 and each having a single die 870A, 870B. The first subassembly 862 has a symmetric lens 860A, and the second subassembly 863 has an asymmetric lens 860B. Each lens 860A, 860B is disposed over an encapsulant 872A, 872B and a symmetric reflector 864A, 864B. The first die 870A is disposed coincident with the principal axis 869A of the first subassembly 862, and the second die 870B is disposed non-coincident with the principal axis 869B of the second subassembly 863.

Figure 12J:
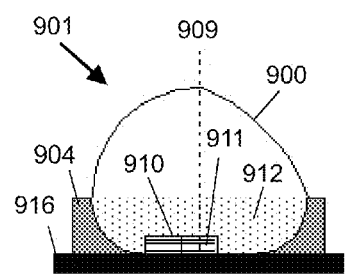
FIG. 12J is a side cross-sectional schematic of a thirteenth surface mount LED package according to the present invention, the package including multiple die, a symmetric reflector, and an asymmetric lens, with one die disposed coincident with the principal axis and the other die disposed non-coincident with the principal axis.

FIG. 12J illustrates a surface mount LED package 901 having a lead frame 916 and two die 910, 911, with one die 911 being disposed coincident with the principal axis 909 and the other die 910 being disposed non-coincident with the principal axis 909. The package 901 further includes an asymmetric lens 900 disposed over an encapsulant 912 and a symmetric reflector 904.

Figure 12K:
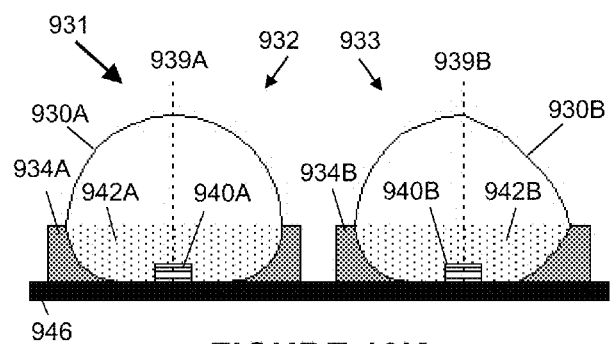
FIG. 12K is a side cross-sectional schematic of a fourteenth surface mount LED package according to the present invention, the package including two lamp subassemblies mounted to a common lead frame, each subassembly having a single die disposed coincident with the principal axis, the first (left) subassembly having a symmetric lens and symmetric reflector, and the second (right) subassembly having an asymmetric lens and an asymmetric reflector.

FIG. 12K illustrates a surface mount LED package 931 including two lamp subassemblies 932, 933 mounted to a common lead frame 946 and each having a single die 940A, 940B disposed coincident with the respective principal axis 939A, 939B. The first subassembly 932 has a symmetric lens 930A, and the second subassembly has an asymmetric lens 930B. Each lens 930A, 930B is disposed over an encapsulant 942A, 942B, with the reflector 934A of the first subassembly 932 being symmetric, and the reflector 934B of the second subassembly 933 being asymmetric.

Figure 12L:
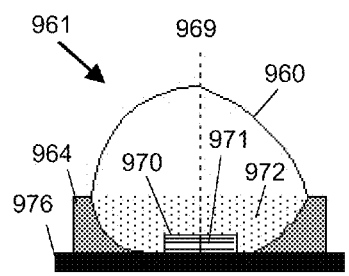
FIG. 12L is a side cross-sectional schematic of a fifteenth surface mount LED package according to the present invention, the package including multiple die, an asymmetric reflector, and an asymmetric lens, with both die being disposed non-coincident with the principal axis but symmetrically arranged equidistantly from the principal axis.

FIG. 12L illustrates a surface mount LED package 961 having a lead frame 976 and two die 970, 971 being disposed non-coincident with the principal axis 969 but symmetrically arranged equidistantly from the principal axis 969. The package 961 further includes an asymmetric lens 960 disposed over an encapsulant 972 and an asymmetric reflector 964.

Figure 12M:
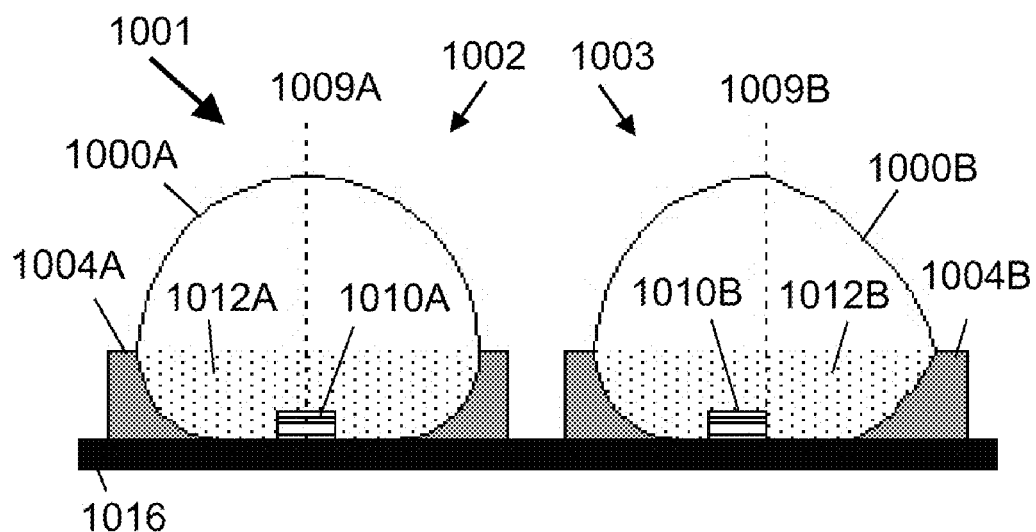
FIG. 12M is a side cross-sectional schematic of a sixteenth surface mount LED package according to the present invention, the package including two lamp subassemblies mounted to a common lead frame, with the first (left) subassembly having a symmetric lens, symmetric reflector, and a die disposed coincident with the principal axis, and with the second (right) subassembly having an asymmetric lens, an asymmetric reflector, and a die disposed non-coincident with the principal axis.
Figure 12N:
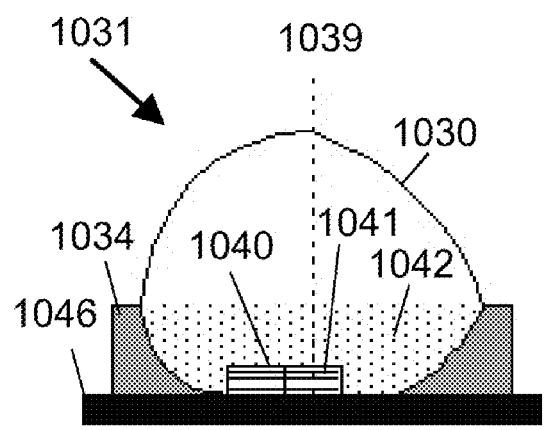
FIG. 12N is a side cross-sectional schematic of a seventeenth surface mount LED package according to the present invention, the package including multiple die, an asymmetric reflector, and an asymmetric lens, with one die disposed coincident with the principal axis and the other die disposed non-coincident with the principal axis.

FIG. 12M illustrates a surface mount LED package 1001 including two lamp subassemblies 1002, 1003 mounted to a common lead frame 1016 and each having a single die 1010A, 1010B. The first die 1010A is disposed coincident with the principal axis 1009A of the first subassembly 1002, and the second die 1010B is disposed non-coincident with the principal axis 1009B of the second subassembly 1003. The first subassembly 1002 has a symmetric lens 1000A, and the second subassembly has an asymmetric lens 1000B. Each lens 1000A, 1000B is disposed over an encapsulant 1012A, 1012B, with the reflector 1004A of the first subassembly 1002 being symmetric, and the reflector 1004B of the second subassembly 1003 being asymmetric.

FIG. 12N illustrates a surface mount LED package 1031 having a lead frame 1046 and two die 1040, 1041. One die 1041 is disposed coincident with the principal axis 1039 and the other die 1040 is disposed non-coincident with the principal axis 1039. The package 1031 further includes an asymmetric lens 1030 disposed over an encapsulant 1042 and an asymmetric reflector 1034.

Certain embodiments of the present invention correspond to a single lamp package having two or more light emitting regions with the intent of focusing or otherwise directing the light in two or more different directions, wherein one light emitting region can be switched independently of a second light emitting region. Properly oriented, a lamp package according to the present invention may be used in a headlight assembly to transition between low beam and high beam operation. For example, low beam operation may correspond to the reflected light originating from the second die, while high beam operation may correspond to the reflected light originating from the first die. Alternatively, low beam operation may correspond to the reflected light originating from one of the LED dies, while high beam operation may correspond to the reflected light from the at least two LED dies. Other combinations are contemplated and readily determinable by one skilled in the art.

In various specific embodiments of the invention, such as those illustratively mentioned above, the spectral output of the each die in a multi-die LED device or package may be white light. For example, a multi-die LED device or package having white light spectral output from each die or combinations of die may be used to provide both high beam and low beam output, preferably with differing intensity and direction of the low and high beams, respectively. In other embodiments, the spectral output of the light emission device may be light having a specific color other than white light as dictated by the color of the two or more LED dies chosen. In a LED employing RGB dies, the color of the light output may also be controlled by the relative amount of red, blue, and green light provided by the individual dies. For example, a first die having white light spectral output may be used for forward (e.g., high and/or low beams) or rearward illumination (e.g., backup lights), and a second yellow die may be utilized for turn signaling utility; or, alternatively, a second red die may be used to indicate application of brakes (i.e., brake lights). In still further embodiments, the spectral output of the light emission device may include output that is outside the visible radiation spectrum. For example, a first die having white light spectral output may be used for visible forward illumination, while a second die having infrared output may be used as part of a night vision enhancement system. In such an embodiment, an infrared beam bathes the road ahead and forward objects in infrared light, a car-mounted forward infrared camera is used to detect objects beyond the reach of the while light beam (e.g., low or high beam lamps), and a display device such as a car-mounted monitor or windshield projector is used to alert the driver to the presence of otherwise imperceptible forward objects. Such an enhanced night vision system is particularly useful in vehicles traveling at night at high rates of speed.

In another embodiment, a lamp is communicatively connected to a photo-sensor capable of imaging the road ahead. If the photo sensor senses that no other automotive lights are present, whether oncoming or traveling ahead in the same direction, the system automatically changes to high beam operation. When traffic is sensed by the photo-sensor, the system automatically changes to low beam operation.

In yet another embodiment, a reflector headlamp includes more than two LED dies to serve as directional headlamps that may be use to enhance lighting while the vehicle is cornering.

The arrangement of the LED dies within the reflector is readily determinable by one skilled in the art upon review of the present disclosure. As indicated previously, surface mount LED packages are preferably used to accommodate the thermal requirements of high-power LEDs. For example, "flip-chip" LED dies with all of the contacts on the bottom surfaces thereof may be employed to advantageously reduce light-blocking problems associated with electrical contacts disposed atop dies, to which electrical wire may be bonded.

To control the amount of light emitted by multiple LED dies, current and/or voltage can be sourced individually to each die, if the associated cost and complexity of wiring and power supply arrangements is suitable for the intended end use application. In one embodiment, multiple LED lamps are mounted to a common electrical distribution element such as printed circuit board. In this manner, power can be distributed to a multitude of lamps with a relatively small number of electrical connections to a power source, with appropriate switching and control functions provided by a microprocessor integrated to the circuit board. For example, with multiple LED lamps mounted to a single circuit board, a single wiring harness may be utilized to connect the lamps to the electrical system of a motor vehicle. Alternatively, light output of the light emission device can be controlled by variation in die fabrication, die shape, die size (area), contact quality, overall structure resistance, or the like, or by altering other aspects of the LED design.

Embodiments of the present invention providing a single LED lamp having two or more light emitting regions may be used for vehicular and/or portable lighting products including, but not limited to, flashlights, lanterns, portable work lights, spotlights, headlights, brake lights, tail lights, turn signal lights, daytime running lights, traffic lights, penlights, recessed lighting, dashboard lighting, or other similar applications.

While the invention has been described herein with reference to specific aspects, features and embodiments, it will be recognized that the invention is not thus limited, but rather extends to and encompasses other variations, modifications and alternative embodiments. Accordingly, the invention is intended to be broadly interpreted and construed to encompass all such other variations, modifications, and alternative embodiments, as being within the scope and spirit of the invention as hereinafter claimed.

What is claimed is:

1. A light emitting diode (LED) package comprising:
a first LED sub-assembly comprising a first LED die, a first reflector having a first principal axis, and a first lens;
a second LED sub-assembly comprising a second LED die, a second reflector having a second principal axis, and a second lens; and
a common lead frame;
wherein the first LED sub-assembly and the second LED sub-assembly are mounted to the common lead frame; and
wherein the first LED sub-assembly is adapted to emit a first beam centered in a first direction, and the second LED sub-assembly is adapted to emit a second beam centered in a second direction that is different from the first direction, wherein the second direction is non-parallel to the first direction.

2. The LED package of claim 1, wherein the first principal axis and the second principal axis are non-parallel.

3. The LED package of claim 1, wherein each of the first LED sub-assembly and the second LED sub-assembly is independently controlled.

4. The LED package of claim 1, wherein each of the first LED sub-assembly and the second LED sub-assembly comprises an encapsulant material at least partially disposed within the associated reflector.

5. The LED package of claim 4, wherein the first lens substantially covers the encapsulant material and the first reflector of the first LED sub-assembly, and the second lens substantially covers the encapsulant material and the second reflector of the second LED sub-assembly.

6. The LED package of claim 1, wherein at least a portion of any of the first reflector, the second reflector, the first lens, and the second lens is faceted.

7. The LED package of claim 1, wherein the first reflector and the second reflector comprises a geometric shape selected from the group consisting of parabolic, ellipsoid, and compound curves.

8. The LED package of claim 1, wherein any of the first reflector and the second reflector is asymmetric.

9. The LED package of claim 1, wherein any of the first lens and the second lens is asymmetric.

10. The LED package of claim 1, wherein the second die is disposed non-coincident with the second principal axis.

11. The LED package of claim 1, wherein the second die is disposed non-coincident with the second principal axis and the second reflector is asymmetric.

12. The LED package of claim 1, wherein the second reflector is asymmetric and the second lens is asymmetric.

13. The LED package of claim 1, wherein the second die is disposed non-coincident with the second principal axis, the second reflector is asymmetric, and the second lens is asymmetric.

14. The LED package of claim 1, wherein any of the first LED die and the second LED die has a spectral output selected from the group consisting of white light, blue light, red light, green light, yellow light, ultraviolet radiation, and combinations thereof.

15. The LED package of claim 1, wherein each of the first LED die and the second LED die has a white light spectral output.

16. The LED package of claim 1, wherein the first LED die has a white light spectral output and the second LED die has an infrared spectral output.

17. The LED package of claim 1, wherein the first LED die has a white light spectral output and the second LED die has a yellow light spectral output.

18. The LED package of claim 1, wherein the first LED die has a white light spectral output and the second LED die has a red light spectral output.

19. The LED package of claim 1, wherein any of the first LED die and the second LED die comprises a RGB die.

20. A lighting product comprising the LED package of claim 1.

21. The LED package of claim 1, wherein at least one of the first LED sub-assembly and the second LED sub-assembly comprises at least one additional LED die.

22. The LED package of claim 21, wherein the at least one additional LED die is independently controllable relative to the first LED die and the second LED die.

23. The LED package of claim 1, further comprising at least one phosphor material arranged to receive light from at least one of the first LED die and the second LED die.

24. The LED package of claim 1, further comprising a third LED sub-assembly comprising a third LED die, a third reflector, and a third lens.

25. The LED package of claim 1, comprising an associated photosensor, wherein operation of the LED package is controlled responsive to an output signal of the photosensor.

26. A method of controlling light originating from a light emitting diode (LED) lamp comprising at least one LED package according to claim 1, the method comprising independently operating the first LED sub-assembly and the second LED sub-assembly.

27. A method according to claim 26, wherein independent operation of the first LED sub-assembly and the second LED sub-assembly includes adjusting any of current and voltage supplied to the first LED sub-assembly and the second LED sub-assembly.

28. A method according to claim 26, wherein independent operation of the first LED sub-assembly and the second LED sub-assembly is performed to control direction of light output by the LED lamp.

29. A method according to claim 26, wherein independent operation of the first LED sub-assembly and the second LED sub-assembly is performed to control color of light output by the LED lamp.

30. A method according to claim 26, wherein each of the first LED sub-assembly and the second LED sub-assembly comprises a white light spectral output.

31. A method according to claim 26, wherein the first LED sub-assembly comprises a white light spectral output and the second LED sub-assembly comprises a yellow light spectral output.

32. A method according to claim 26, wherein the first LED sub-assembly comprises a white light spectral output and the second LED sub-assembly comprises a red light spectral output.

33. A method according to claim 26, wherein the first LED sub-assembly comprises a white light spectral output and the second LED sub-assembly comprises an infrared light spectral output.

34. A method according to claim 26, wherein at least one of the first LED sub-assembly and the second LED subassembly comprises a spectral output selected from the group consisting of white light, blue light, red light, green light, yellow light, ultraviolet radiation, and combinations thereof.

35. A method according to claim 26, wherein any of the first LED sub-assembly and the second LED sub-assembly comprises multiple LEDs.

36. A method according to claim 26, wherein each of the first LED sub-assembly and the second LED sub-assembly comprises multiple LEDs.

37. A method according to claim 36, wherein each LED of each LED sub-assembly is independently controllable.

38. A method according to claim 26, wherein the at least one of the first LED sub-assembly and the second LED sub-assembly comprises a RGB LED package.

39. A method according to claim 26, wherein the first LED sub-assembly comprises a first RGB LED package, and the second LED sub-assembly comprises a second RGB LED package.

40. A method according to claim 26, further comprising controlling operation of at least one of the first LED sub-assembly and the second LED sub-assembly responsive to an output signal of a photosensor.

* * * * *